US009853116B2

(12) United States Patent
Guo et al.

(10) Patent No.: US 9,853,116 B2
(45) Date of Patent: Dec. 26, 2017

(54) PARTIAL SACRIFICIAL DUMMY GATE WITH CMOS DEVICE WITH HIGH-K METAL GATE

(71) Applicant: INTERNATIONAL BUSINESS MACHINES CORPORATION, Armonk, NY (US)

(72) Inventors: Dechao Guo, Fishkill, NY (US); Wilfried E. Haensch, Somers, NY (US); Shu-jen Han, Cortlandt Manor, NY (US); Daniel J. Jaeger, Wappingers Falls, NY (US); Yu Lu, Hopewell Junction, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/968,471

(22) Filed: Dec. 14, 2015

(65) Prior Publication Data
US 2016/0099332 A1    Apr. 7, 2016

Related U.S. Application Data

(60) Continuation of application No. 14/657,723, filed on Mar. 13, 2015, now Pat. No. 9,299,795, which is a
(Continued)

(51) Int. Cl.
*H01L 29/76* (2006.01)
*H01L 29/94* (2006.01)
(Continued)

(52) U.S. Cl.
CPC .... *H01L 29/4925* (2013.01); *H01L 29/42372* (2013.01); *H01L 29/456* (2013.01);
(Continued)

(58) Field of Classification Search
CPC .... H01L 29/78; H01L 29/456; H01L 29/4975
(Continued)

(56) References Cited

U.S. PATENT DOCUMENTS 6,198,142 B1 * 3/2001 Chau ................... H01L 29/0653
257/344
6,214,713 B1   4/2001 Shiao
(Continued)

OTHER PUBLICATIONS

Kelin J. Kuhn, "CMOS Transistor Scaling Past 32nm and Implications on Variation," 978-1-4244-6510-7/10 IEEE, ASMC 2010. pp. 241-246.

*Primary Examiner* — Theresa T Doan
(74) *Attorney, Agent, or Firm* — Tutunjian & Bitetto, P.C.; Vazken Alexanian

(57) ABSTRACT

A gate structure in a semiconductor device includes: a gate stack formed on a substrate with three sections, a bottom portion, a top portion, and a sacrificial cap layer over the top portion; gate spacers, source and drain regions, a nitride encapsulation over top and sidewalls of the gate stack after removal of the sacrificial cap layer, an organic planarizing layer over the nitride encapsulation, planarizing the encapsulation, and silicidation performed over the source and drain regions and the bottom portion after removal of the nitride encapsulation, the organic planarizing layer, and the top portion of the gate stack.

9 Claims, 12 Drawing Sheets

Related U.S. Application Data division of application No. 13/757,809, filed on Feb. 3, 2013, now Pat. No. 9,041,076.

(51) Int. Cl.
  *H01L 29/49* (2006.01)
  *H01L 29/66* (2006.01)
  *H01L 29/423* (2006.01)
  *H01L 29/45* (2006.01)
  *H01L 21/28* (2006.01)
  *H01L 29/78* (2006.01)

(52) U.S. Cl.
  CPC ........ *H01L 29/665* (2013.01); *H01L 29/6653* (2013.01); *H01L 29/6656* (2013.01); *H01L 29/66477* (2013.01); *H01L 29/66545* (2013.01); *H01L 29/78* (2013.01); *H01L 21/28052* (2013.01); *H01L 29/66628* (2013.01); *H01L 29/66636* (2013.01); *H01L 29/7848* (2013.01)

(58) Field of Classification Search
  USPC ....................................................... 257/288
  See application file for complete search history.

(56) References Cited

U.S. PATENT DOCUMENTS

| | | | |
|---|---|---|---|
| 6,333,223 | B1 | 12/2001 | Moriwaki et al. |
| 7,056,782 | B2 | 6/2006 | Amos et al. |
| 7,138,323 | B2 | 11/2006 | Kavalieros et al. |
| 7,544,594 | B2 | 6/2009 | Change |
| 7,723,174 | B2 | 5/2010 | Waite et al. |
| 7,977,181 | B2 | 7/2011 | Lai et al. |
| 7,981,740 | B2 | 7/2011 | Lenski et al. |
| 8,021,942 | B2 | 9/2011 | Wei et al. |
| 8,138,037 | B2 | 3/2012 | Chudzik et al. |
| 8,426,300 | B2 | 4/2013 | Ramachandran et al. |
| 9,299,795 | B2 * | 3/2016 | Guo ................. H01L 29/665 |
| 2004/0262784 | A1 * | 12/2004 | Doris ............... H01L 21/82386 257/314 |
| 2008/0026572 | A1 | 1/2008 | Wirbeleit et al. |
| 2008/0102573 | A1 * | 5/2008 | Liang ............... H01L 21/82381 438/231 |
| 2008/0217665 | A1 * | 9/2008 | Chen ................ H01L 21/82380 257/288 |
| 2010/0087055 | A1 * | 4/2010 | Lai .................. H01L 21/82384 438/585 |
| 2011/0101893 | A1 | 5/2011 | Heid |
| 2014/0120707 | A1 | 5/2014 | Ando et al. |
| 2014/0217481 | A1 | 8/2014 | Guo et al. |

* cited by examiner

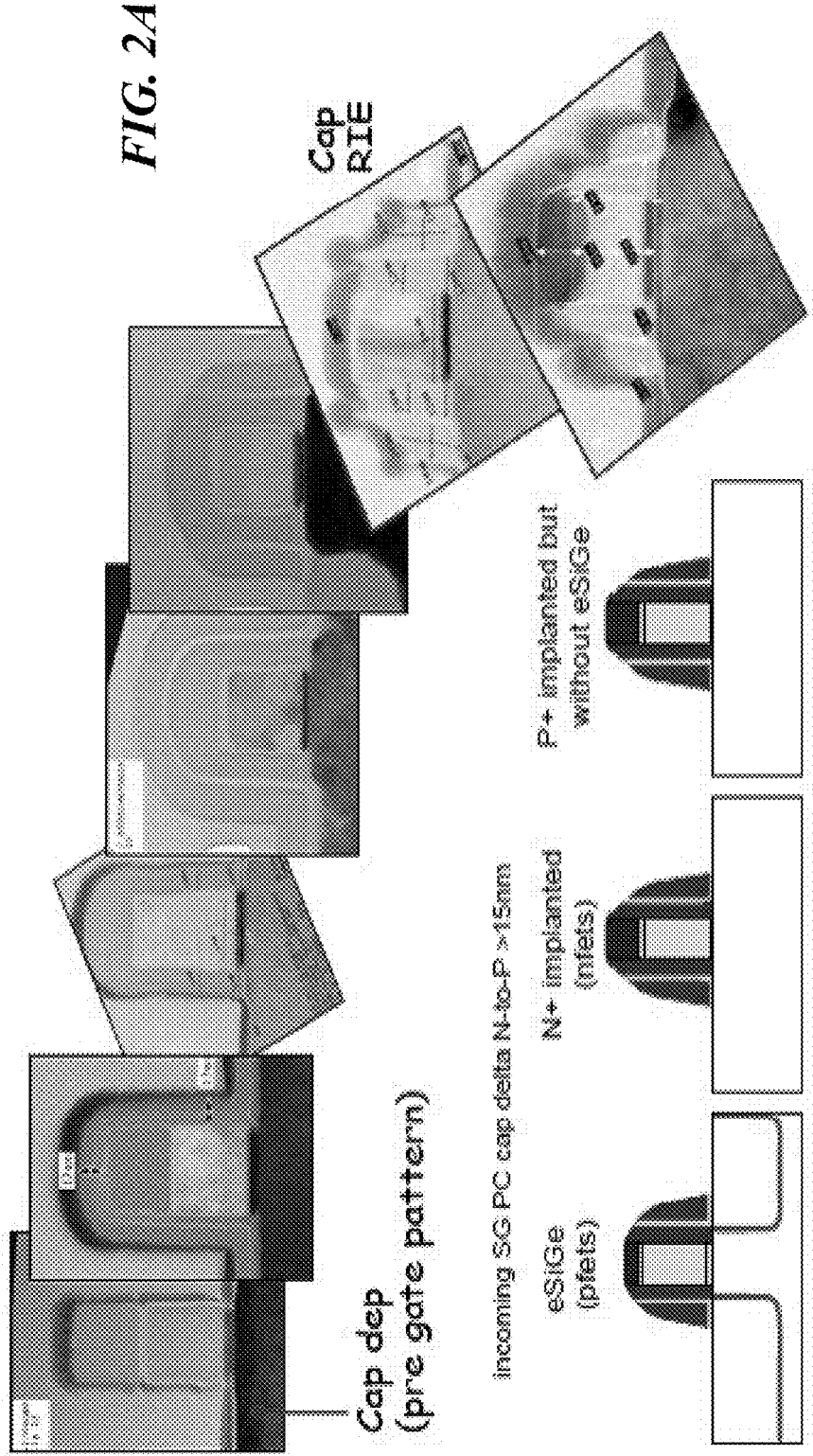

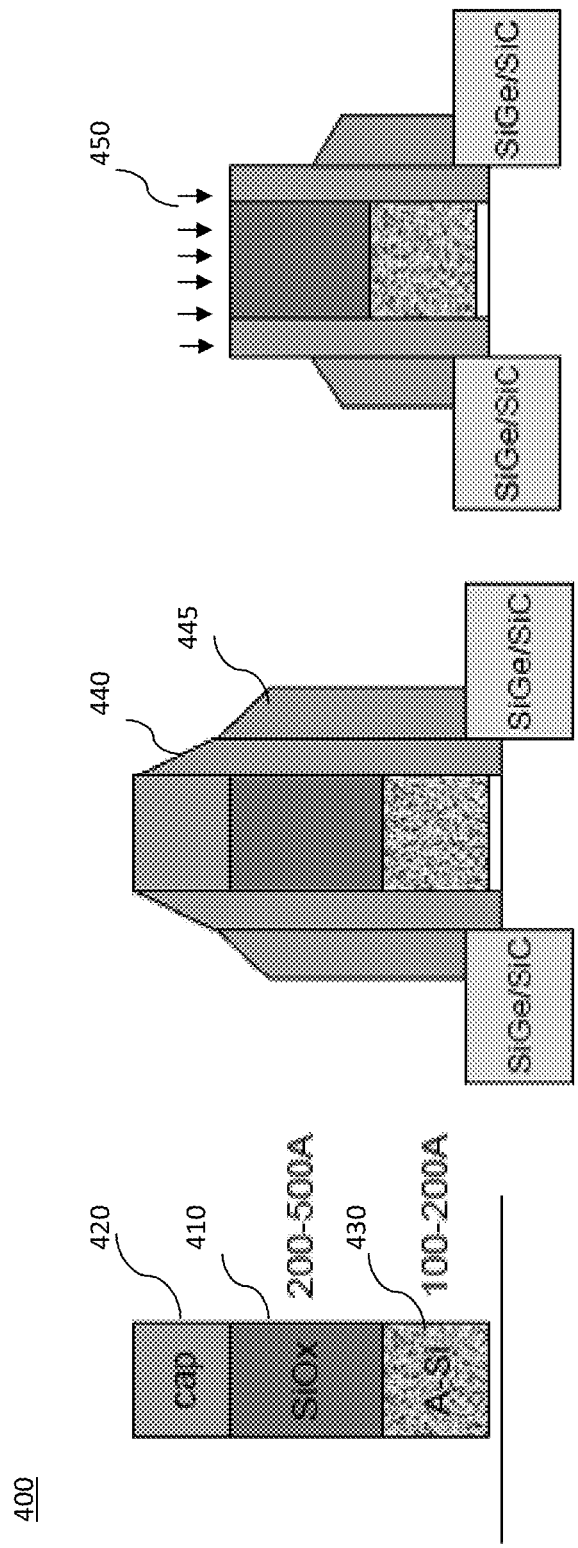

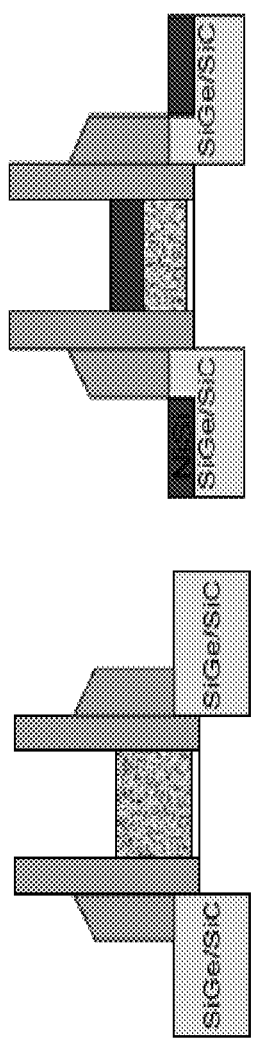
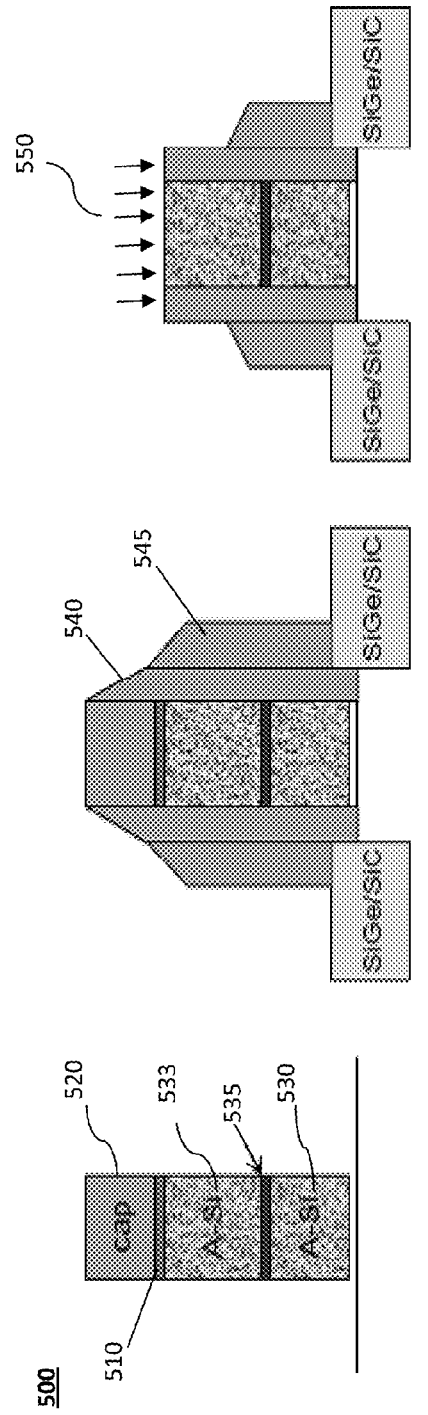
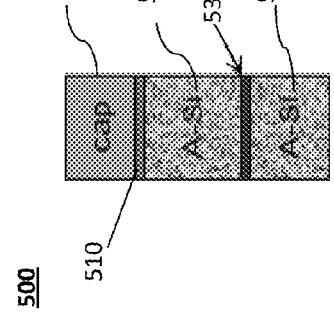

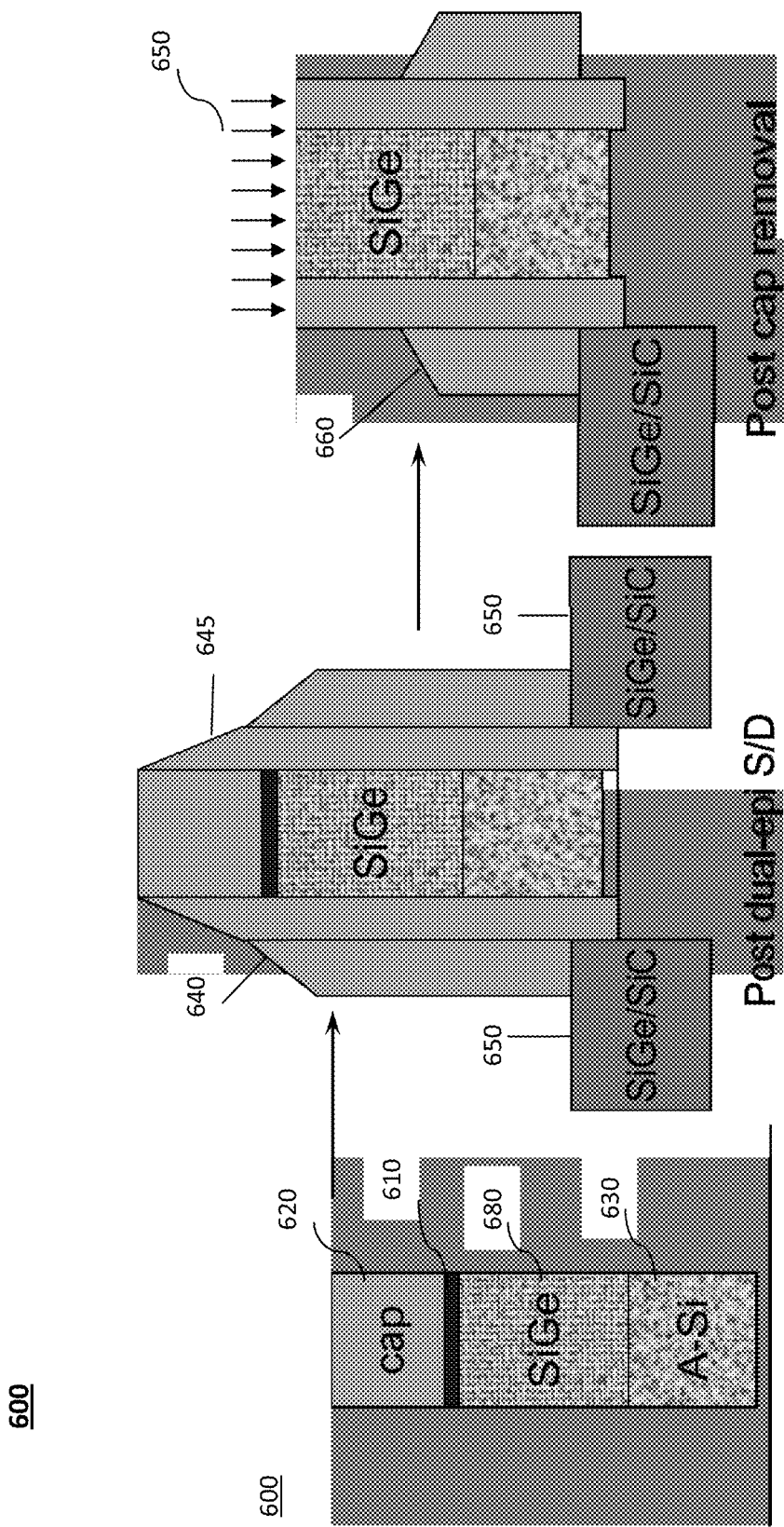

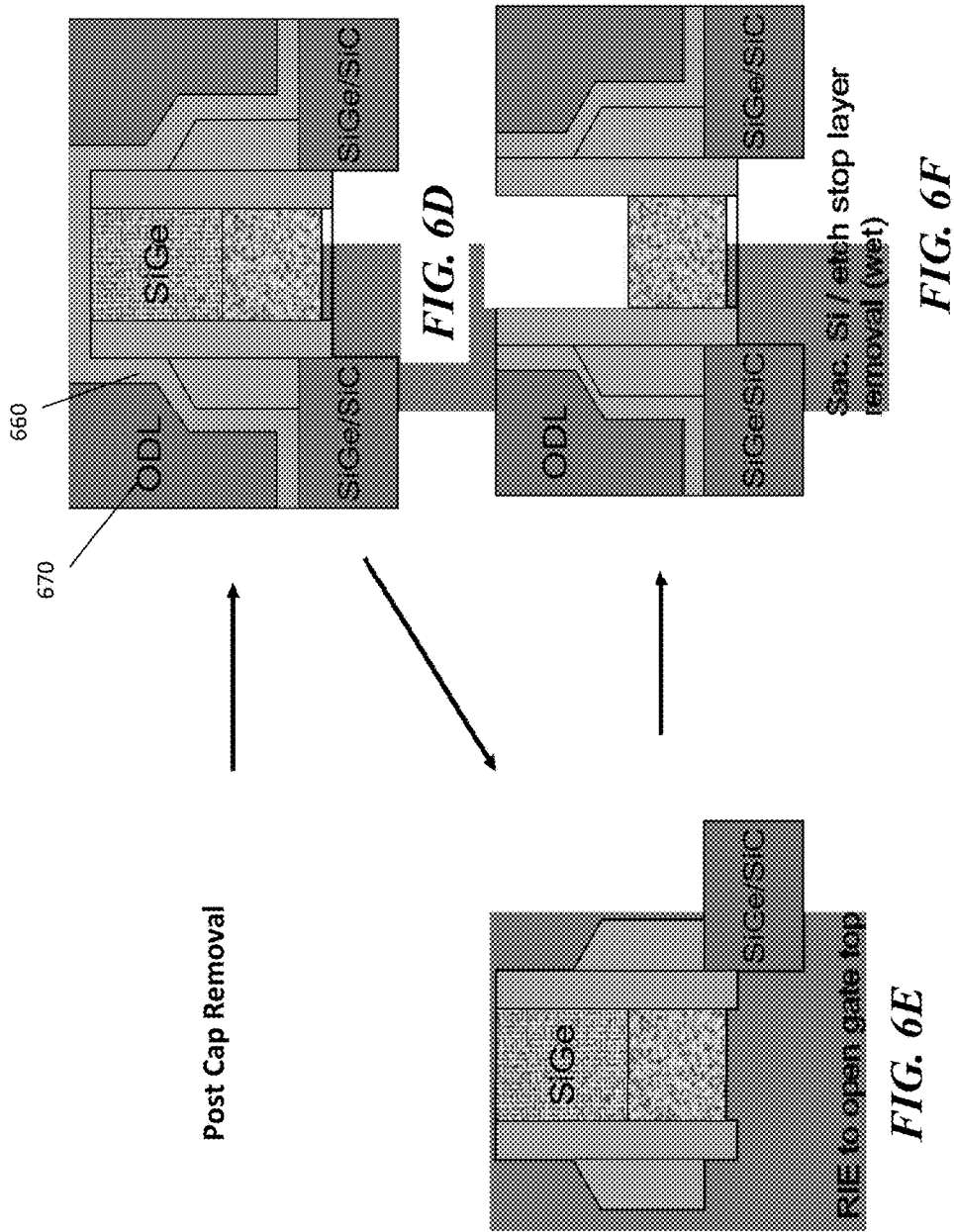

PARTIAL SACRIFICIAL DUMMY GATE WITH CMOS DEVICE WITH HIGH-K METAL GATE

CROSS-REFERENCE TO RELATED APPLICATIONS

This application is related to U.S. patent application Ser. No. 13/662,505, filed on Oct. 28, 2012, entitled "Method to Improve Reliability of High-k Metal Gate Stacks," the entire content of which is incorporated herein by reference. This application is also a Continuation Application of U.S. patent application Ser. No. 14/657,723, filed on Mar. 13, 2015, which is a Divisional Application of allowed U.S. Pat. No. 9,041,076, filed on Feb. 3, 2013, both incorporated herein by reference in its entirety.

FIELD OF THE INVENTION

The invention disclosed broadly relates to the field of gate electrodes in integrated circuits, and more particularly relates to the field of high-k metal gate electrodes.

BACKGROUND OF THE INVENTION

In the semiconductor industry, Moore's law states that the number of transistors on a chip doubles approximately every two years. These exponential performance gains present a challenge to the semiconductor manufacturing industry, along with the dual challenges of promoting power savings and providing cooling efficiency. The industry faces these challenges in multiple ways. Reducing gate height can reduce gate capacitance and increase device performance. Furthermore, gate height is limited by the requirement of source/drain ion implantation steps due to reducing space between gate electrodes. In a gate-first process flow, the minimum gate height is limited by the need to remove the cap nitride layer on top of the polysilicon or a-Si prior to the silicidation process. Since a nitride spacer will be etched together with the cap nitride layer during the cap nitride removal etch with essentially no selectivity, too short a gate (which implies a short spacer) will lead to complete spacer removal and damage to the high-k metal gate. The unprotected metal gate is susceptible to damage from chemistry in cleaning steps, or oxygen could diffuse into the high-k metal gate and change the Vt (voltage) of the devices. This problem is exacerbated by the inherent differences in topography between the silicon substrate and STI, and furthermore the source/drain process differences on different types of transistor devices on the same wafer.

Referring now in specific detail to the drawings, and particularly to FIGS. 1A, 1B, and 1C, there is provided an illustration of a gate patterning process, according to the known art. These TEM images show the progression of the gate profile through the gate patterning process steps. FIG. 1A shows a typical gate profile after silicon nitride (SiN) hard mask reactive ion etching (RIE). The arrow of FIG. 1A points to the inherent topography differences between the silicon substrate and the STI. FIG. 1B shows a typical gate profile after the polysilicon etch step. FIG. 1B illustrates the height difference for gates over silicon and polysilicon wires over STI clearly.

FIG. 1C shows a typical gate profile after the completion of high-k/metal gate etch. The cap nitride is essentially intact. FIG. 1C also illustrates the relative proportion of polysilicon and cap nitride heights in a typical state-of-the-art semiconductor process technology using a high-k metal gate.

FIG. 2A shows the spacer/encapsulation to silicidation process sequence according to the known art. Starting from the finished gate at the left (same image as in FIG. 1C), the typical gate goes through first spacer nitride deposition and etch on the p-type transistor region (second and third images), source/drain ion implantation steps, embedded SiGe etch/growth in the p-type transistor region, cap nitride removal etch, and silicidation. As a result of limited starting height of the spacer nitride, starting topography, and the multitude of etch steps the wafer is subjected to, only a small amount of nitride spacer is left for some gates to separate the gate from the source/drain region at the silicidation step in the known art. This lack of nitride separation causes yield loss and increased defect level on the wafer. FIG. 2B shows the difference in cap nitride thickness due to different process flows on n-type transistor and p-type transistor by an example. The example process includes embedded SiGe source/drain to enhance the performance of the p-type transistor by applying stress to the channel region. In this example process flow, the p-type transistor is subjected to an additional etch step to create the cavity in the source/drain region. This cavity etch can erode the cap nitride layer significantly, by as much as half of its starting thickness.

FIG. 3 shows the cap removal process, specifically typical gate profiles for excessive cap nitride RIE or overly conservative cap nitride RIE. FIG. 3 shows that if the cap nitride RIE is too much, the spacer nitride will be etched too much and some gates will be damaged or some gates will have an electric short to the source/drain region. If the cap nitride RIE is not enough to clear all the cap nitride from all gates, some gates will fail to form silicide, which leads to high resistance spots and circuit failure. The process window is determined with the initial gate height as compared to the variation in cap nitride top surface level caused by topography and different process history on different devices.

SUMMARY OF THE INVENTION

Briefly, according to an embodiment of the invention a gate structure in a semiconductor device includes: a gate stack formed on a substrate with three sections: a bottom portion, a top portion, and a sacrificial cap layer over the top portion; gate spacers; source and drain regions; a nitride encapsulation over top and sidewalls of the gate stack after removal of the sacrificial cap layer; an organic planarizing layer over the nitride encapsulation, planarizing the encapsulation; and silicidation performed over the source and drain regions and the bottom portion after removal of the nitride encapsulation, the organic planarizing layer, and the top portion of the gate stack.

According to an embodiment of the present invention, a method of fabrication of the above gate structure includes steps or acts of: forming a patterned gate stack on a substrate, the patterned gate stack having three layers: a bottom portion, a top portion, and a cap layer; forming gate spacers on vertical sidewalls of the gate stack; forming source and drain regions on opposite sides of the gate spacers; removing the cap layer; encapsulating top and sidewalls of the gate stack with nitride; planarizing the nitride encapsulation using an organic planarizing layer; removing a top portion of the nitride encapsulation; removing the top portion of the gate stack; removing a remaining portion of the nitride encapsulation and the organic planarizing layer; and performing silicidation over the source and drain regions and the bottom portion of the gate stack.

According to another embodiment of the present invention, a method of fabrication of another gate structure includes steps or acts of: forming a patterned gate stack on a substrate, the patterned gate stack having four layers: a bottom portion formed of a first material, a top portion formed of the first material, a thin separation layer of a second material, and a cap layer; forming gate spacers on vertical sidewalls of the gate stack; forming source and drain regions on opposite sides of the gate spacers; removing the cap layer; encapsulating top and sidewalls of the gate stack with nitride; planarizing the nitride encapsulation using an organic planarizing layer; removing a top portion of the nitride encapsulation; removing the top portion of the gate stack; removing a remaining portion of the nitride encapsulation and the organic planarizing layer; and performing silicidation over the source and drain regions and the bottom portion of the gate stack.

According to another embodiment of the present invention, a method of fabrication of another gate structure includes steps or acts of: forming a patterned gate stack on a substrate, the patterned gate stack having three layers: a bottom portion, a top portion formed of a layer of silicon-germanium, and a cap layer; forming gate spacers on vertical sidewalls of the gate stack; forming source and drain regions on opposite sides of the gate spacers; removing the cap layer; encapsulating top and sidewalls of the gate stack with nitride; planarizing the nitride encapsulation using an organic planarizing layer; removing a top portion of the nitride encapsulation; removing the top portion of the gate stack; removing a remaining portion of the nitride encapsulation and the organic planarizing layer; and performing silicidation over the source and drain regions and the bottom portion of the gate stack.

BRIEF DESCRIPTION OF THE SEVERAL VIEWS OF THE DRAWINGS

To describe the foregoing and other exemplary purposes, aspects, and advantages, we use the following detailed description of an exemplary embodiment of the invention with reference to the drawings, in which:

FIGS. 2A and 2B show a spacer/encapsulation sequence according to the known art;

FIGS. 4A through 4H show the sacrificial dummy gate formation, according to an embodiment of the present invention;

FIGS. 5A through 5H show the sacrificial dummy gate formation, according to another embodiment of the present invention; and FIGS. 6A through 6H show the sacrificial dummy gate formation, according to yet another embodiment of the present invention.

Figure 1B:
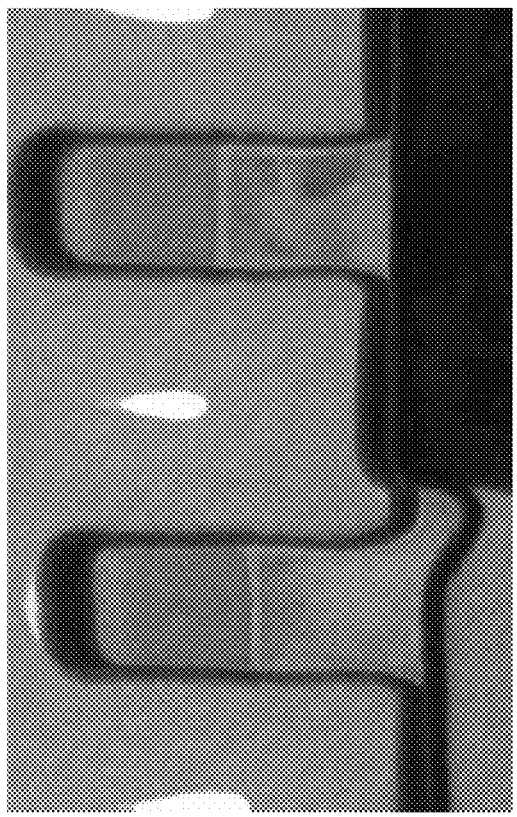
FIGS. 1A through 1C show different steps in a gate patterning process, according to the known art.
Figure 1A:
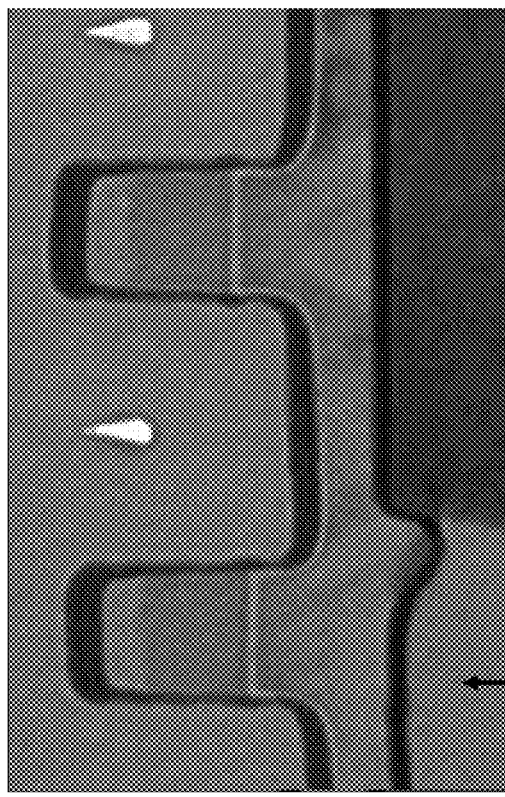
Figure 1C:
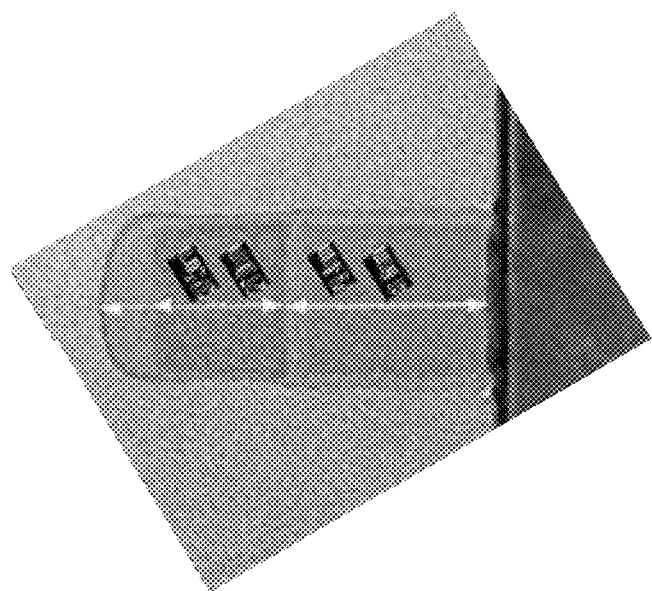
Figure 3:
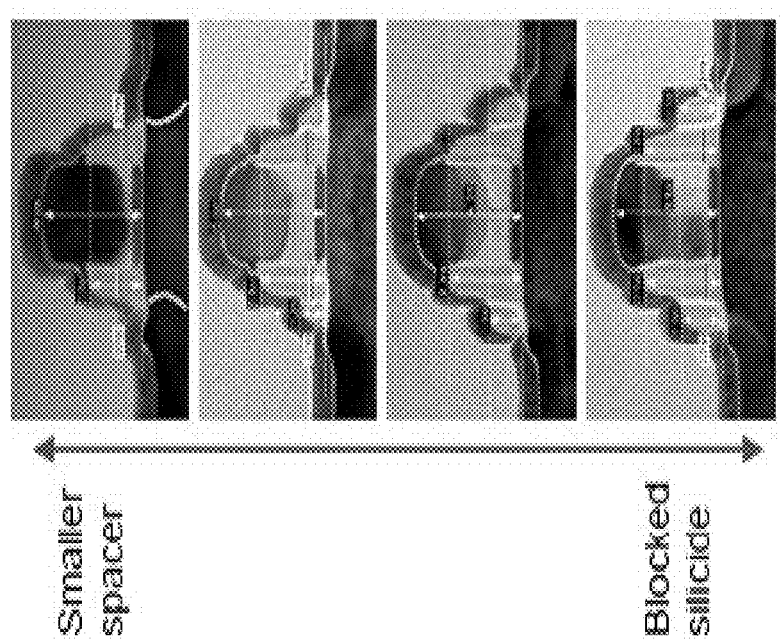
FIG. 3 shows a cap removal process, according to the known art.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

Before describing in detail embodiments that are in accordance with the present invention, it will be appreciated that for simplicity and clarity of illustration, common and well-understood elements that are useful or necessary in a commercially feasible embodiment may not be depicted in order to facilitate a less obstructed view of these various embodiments. We provide a glossary of terms used with reference to the drawings:

Glossary

A-Si—amorphous silicon
SiOx—silicon oxide
SiGe—silicon germanide
SiC—silicon carbide
RIE—reactive ion etching
TEM—transmission electron microscropy
ODL—optically dense layer; organically dielectric layer
OPL—organic planarization layer
STI—shallow trench isolation
S/D—source and drain terminals
NiSi—nickel silicide
C (DLC)—metal-free diamond-like carbon coating
SiN—silicon nitride
k—dielectric constant value
high-k—having a 'K' value-higher than 3.9 k, the dielectric constant of silicon dioxide We describe a sacrificial dummy gate for a semiconductor device. In addition, we provide a method for fabricating a gate electrode stack in a semiconductor device. The gate electrode we propose consists of two parts: a bottom part formed of material similar to that in a conventional gate stack; and the sacrificial top part which will be chemically removed prior to the silicidation process. We produce a tall gate initially, then remove the top part of the gate prior to the silicidation process. Process window and yield advantage can result if the starting gate hard mask thickness can be increased prior to silicidation without increasing cap nitride thickness or final gate height.

In an embodiment of the present invention to be discussed in detail below, we apply the sacrificial dummy gate to a gate-first structure. In a gate-first approach (such as that used in a high-k/metal gate CMOS process), the gate stack is formed before the source and drain regions, and is typically silicided after source/drain process to reduce resistivity. In a gate-last approach, the gate stack is formed after the source and drain process by replacing dummy gate structures. An exemplary gate stack in gate-first technology consists of gate hard-mask (typically silicon nitride), polysilicon, work-function metal, high-k gate dielectric, and silicon oxide interfacial layer.

After the gate stack is formed and patterned on a silicon wafer substrate, a conformal spacer material (typically silicon nitride) is deposited and etched in a process with high directionality to form the spacers. If the technology includes epitaxial source/drain for strain enhancement, the spacer process might be repeated for the other device polarity. After the source/drain process and associated implants for junction engineering, the gate hard-mask is removed to expose the polysilicon material for the silicidation step.

This novel approach to gate technology has many applications in the fields of consumer devices and appliances, mobile applications, network equipment, telecom equipment, and user devices and interfaces, to name a few.

Referring now to FIGS. 4A, 4B, 4C we show an embodiment of the present invention, where a thick silicon oxide layer is used as the sacrificial gate material to increase the gate height during spacer and source/drain process steps. FIG. 4A shows an initial gate stack 400 after gate patterning. A silicon oxide layer 410 of thickness in the range of 200 A to 500 A is added under the gate hard-mask (the cap layer 420) and above the polysilicon layer 430 (the amorphous-silicon A-Si layer). The thickness of layers 410, 420, and 430 in FIG. 4A is only for illustration purposes and not meant to limit the applicability of the claims.

FIG. 4B shows the gate structure after the dual-epitaxial source/drain process. For illustration purposes, two spacer processes 440 and 445 are shown along the sidewalls of the gate stack 400. The tops of the spacers 440 and 445 are slanted as is typical after the spacer-etch process. The height of both spacers 440 and 445 is defined by the combined thickness of the polysilicon 430, the sacrificial oxide 410, and the gate hard mask 420 layers. FIG. 4C shows the gate structure post cap removal process. The gate hard-mask 420 has been etched away 450 at this point of the process flow. The height of spacers 440 and 445 are also reduced during the gate hard-mask (cap) etch 450.

Figures 4D, 4E, 4F:
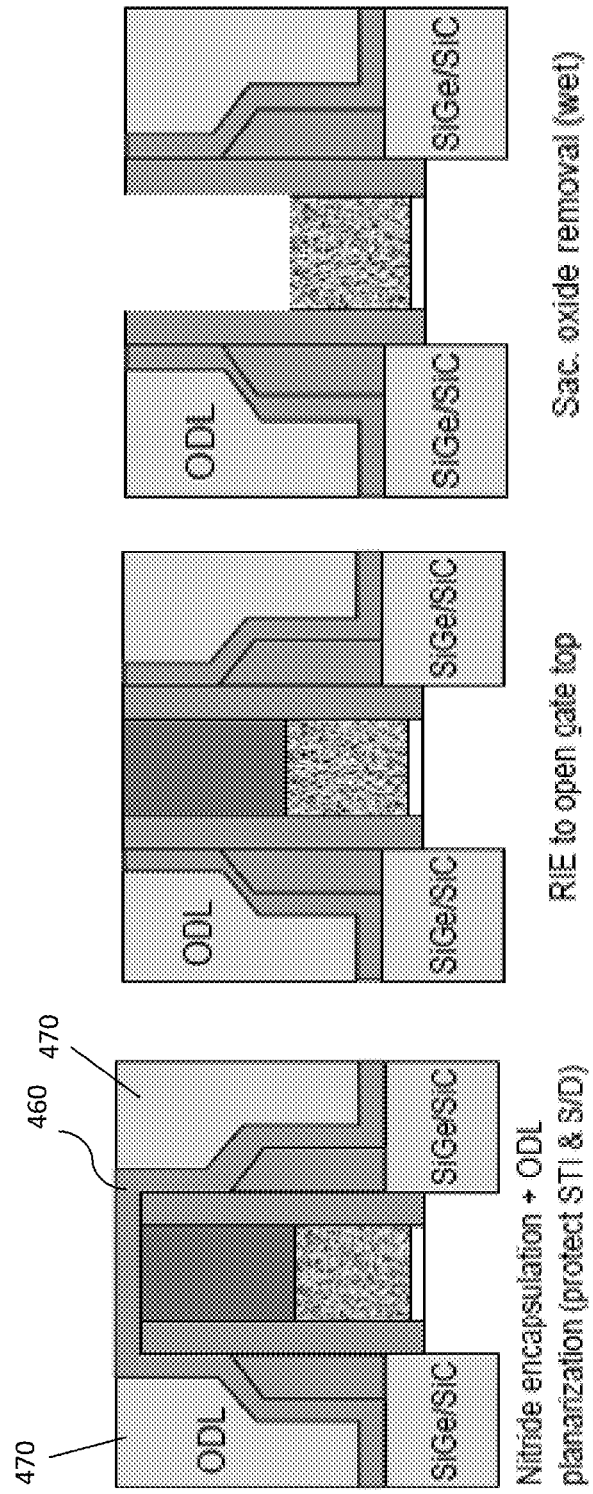

Next, another conformal silicon nitride layer 460 is deposited, as shown in FIG. 4D. Furthermore, an organic planarizing layer (OPL) 470 is spin-coated to planarize the wafer. These layers are used to protect the shallow-trench-isolation (STI) and the source/drain areas during formation. FIG. 4E shows the RIE process step to remove residual OPL 470 and the protective silicon nitride layer 460 to open the top of the gate 400. FIG. 4F shows the sacrificial oxide 410 removal process. An exemplary process is wet etch using chemicals selective to OPL and silicon nitride. FIG. 4G shows the OPL/nitride removal process by typical reactive-ion-etching/wet etching process. FIG. 4H shows the finished gate structure 400 after the silicidation process.

Figure 5D:
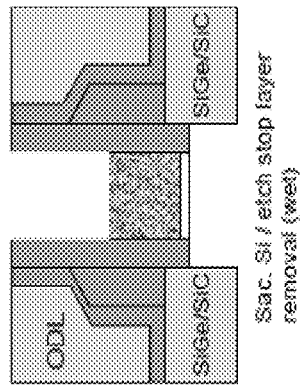

Referring now to FIGS. 5A-5H, we discuss another embodiment of the present invention, where a sacrificial polysilicon layer 510 is used to increase the initial gate height. FIG. 5A shows the initial gate stack 500 post gate patterning. A second polysilicon or amorphous silicon (A-Si) layer 533 is deposited over a thin separation layer 535, which is over the final polysilicon or amorphous silicon layer 530. An exemplary material choice for the separation layer 535 would be diamond-like-carbon or amorphous carbon. The main requirement for this separation layer 535 is to provide a etch stop for the removal of the sacrificial polysilicon layer 533. On top of the second polysilicon layer 533, a thin silicon oxide layer 510 is deposited and then the gate hard mask or cap nitride layer 520 is deposited. The thin silicon oxide layer 510 is optional and does not change the main idea disclosed in this invention.

FIG. 5B shows the post dual-epitaxial source/drain process. For illustration purposes, two spacer processes 540 and 545 are shown. Again, the top of the spacer 540 is slanted as is typical after the spacer-etch process. The height of the both spacers 540 and 545 are defined by the combined thickness of the first polysilicon 530, the separation layer 535, the sacrificial polysilicon layer 533, and the gate hard mask layers 520. In other words, the height of the spacers 540 and 545 will not exceed the combined height of the layers 530, 533, 535, and 520. FIG. 5C shows the gate structure after the cap removal process. The gate hard-mask 520 has been etched away 550 at this point of the process flow. The height of the spacers 540 and 545 is also reduced during the gate hard-mask (cap) etch 550.

Figure 5E:
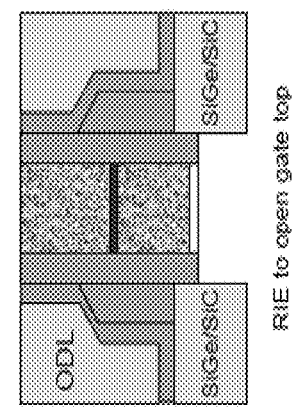
Figure 5F:
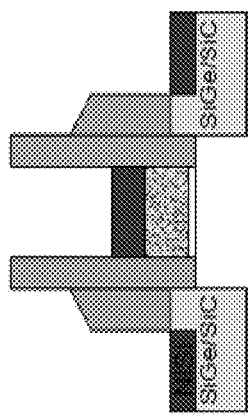
Figure 5G:
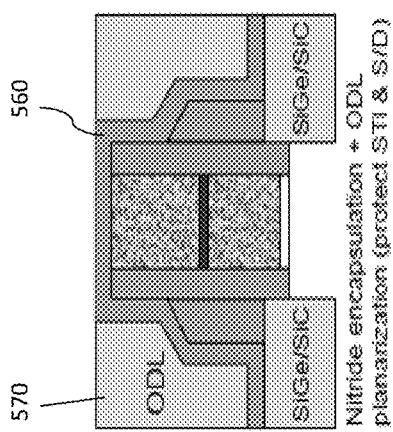
Figure 5H:
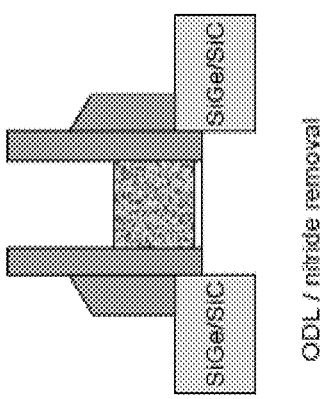

Next, another conformal silicon nitride layer 560 is deposited, as shown in FIG. 5D. Furthermore, an organic planarizing layer (OPL) 570 is spin-coated to planarize the wafer. These layers are used to protect the shallow-trench-isolation (STI) and the source/drain areas during formation. FIG. 5E shows the RIE process step to remove residual OPL 570 and the protective silicon nitride layer 560 to open the top of the gate 500. FIG. 5F shows the sacrificial polysilicon and separation layer removal process. An exemplary process is wet etch using chemicals selective to the separation layer, OPL, and silicon nitride. FIG. 5G shows the OPL/nitride removal process by typical reactive-ion-etching/wet etching process. FIG. 5H shows the finished gate structure 500 after the silicidation process.

Figures 6G, 6H:
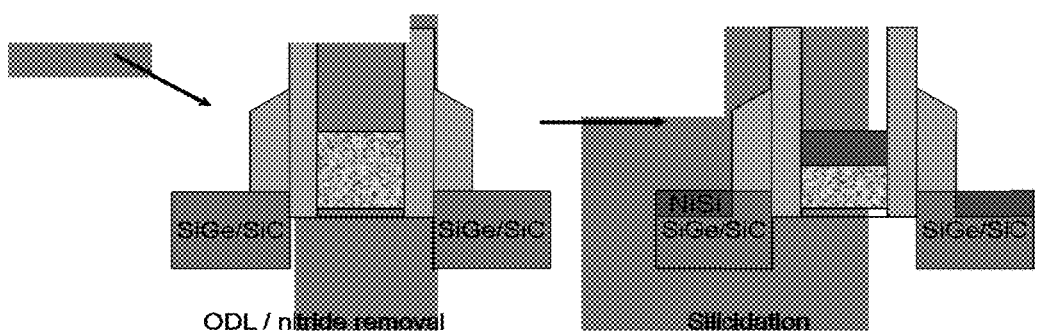

Referring now to FIGS. 6A-6H, we discuss a third embodiment of the present invention, where an epitaxially grown silicon-germanium layer 680 is used to increase initial gate height. FIG. 6A shows the initial gate stack 600 post gate patterning. A silicon-germanium layer 680 is grown over the polysilicon or amorphous silicon layer 630. The exact composition of the silicon-germanium layer 680 is not critical. The main requirement for this silicon-germanium layer 680 is to have sufficient etch selectivity to the polysilicon layer 630 so that the silicon-germanium layer 680 can be easily removed later. On top of the silicon-germanium layer 680, a thin silicon oxide layer 610 is deposited and then the gate hard mask or cap nitride layer 620 is deposited. The thin silicon oxide layer 610 is optional and does not change the main idea disclosed in this invention.

FIG. 6B shows the post dual-epitaxial source and drain formation process. For illustration purposes, two spacer processes 640 and 645 are shown. The top of the spacers 640 and 645 are slanted as is typical after the spacer-etch process. The height of both spacers 640 and 645 are defined by the combined thickness of the first polysilicon, the sacrificial silicon-germanium layer, and the gate hard mask layers. FIG. 6C shows the gate structure post cap removal process. The gate hard-mask has been etched away at this point of the process flow. The height of spacers 640 and 645 are also reduced during the gate hard-mask (cap) etch 650.

Next, another conformal silicon nitride layer 660 is deposited, as shown in FIG. 6D. Furthermore, an organic planarizing layer (OPL) 670 is spin-coated to planarize the wafer. These layers are used to protect the shallow-trench-isolation (STI) and the source/drain areas. FIG. 6E shows the RIE process step to remove residue OPL 670 and the protective silicon nitride layer 660 to open the top of the gate 600. FIG. 6F shows the sacrificial silicon-germanium layer removal process. An exemplary process is reactivity-ion-etch that is selective to polysilicon, OPL, and silicon nitride. FIG. 6G shows the OPL/nitride removal process by typical reactive-ion-etching/wet etching process. FIG. 6H shows the finished gate structure 600 after the silicidation process.

Figure 7:
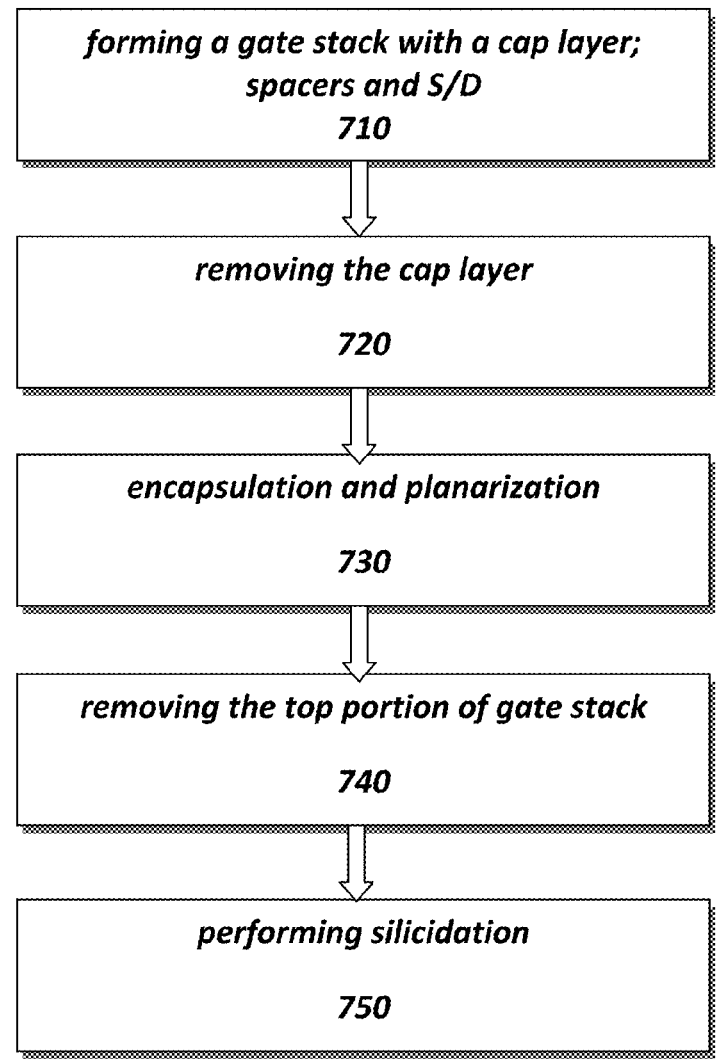
FIG. 7 is a flowchart of the process for forming a sacrificial dummy gate, according to an embodiment of the present invention.

Referring now to FIG. 7 we show a flowchart 700 of a method for forming a gate electrode with a sacrificial top layer. In step 710 we form a gate stack with a top portion, a bottom portion, and a cap layer. Additionally, we provide gate spacers on either side of the gate and the source and drain terminals. In step 720 we remove the cap layer. After the cap removal, the spacer height extends higher than the final gate height.

In step 730 we perform encapsulation and planarization. We start by encapsulating the top and sidewalls of the gate stack with nitride. Then we planarize the nitride encapsulation using an organic planarization material (OPL) such as ODL, a product of Shin-Etsu Chemical Co., Ltd., NFC top coating material available from Japan Synthetic Rubber, or HM800X (available from Japan Synthetic Rubber), thus protecting the source and drain terminals.

In step 740 we remove the top portion of the nitride encapsulation, along with a top portion only of the gate stack. Then we remove the remaining nitride encapsulation and the optically dense layer. Lastly, in step 750 we perform silicidation over the source and drain regions and the bottom (remaining) portion of the gate stack.

Therefore, while there has been described what is presently considered to be the preferred embodiment, it will understood by those skilled in the art that other modifications can be made within the spirit of the invention. The above description(s) of embodiment(s) is not intended to be exhaustive or limiting in scope. The embodiment(s), as described, were chosen in order to explain the principles of the invention, show its practical application, and enable those with ordinary skill in the art to understand how to make and use the invention. It should be understood that the invention is not limited to the embodiment(s) described above, but rather should be interpreted within the full meaning and scope of the appended claims.

The invention claimed is:

1. A gate structure in a semiconductor device, comprising:
a patterned gate stack formed on a substrate;
first spacers formed on vertical sidewalls of the gate stack;
second spacers formed on a portion of vertical sidewalls of the first spacers, the first spacers extending above a top surface of the second spacers and having a greater height than the second spacers and a base offset from a base of the second spacers;
source and drain regions on opposite sides and adjacent to the first spacers, and in direct contact with the base of the second spacers; and
silicided regions disposed over the source and drain regions and the patterned gate stack, the first and second spacers extending above a top surface of the silicide regions positioned over the patterned gate stack.

2. The gate structure of claim 1, wherein the second spacers are formed over at least a portion of the source and drain regions.

3. The gate structure of claim 1, wherein the silicided regions disposed over the source and drain regions extend horizontally from the second spacers.

4. The gate structure of claim 1, wherein the silicided regions include nickel silicide.

5. The gate structure of claim 1, wherein a bottom portion of the gate stack includes one of a polysilicon or amorphous silicon.

6. The gate structure of claim 1, wherein the first and second spacers include silicon nitride.

7. The gate structure of claim 1, wherein a height of the first spacers exceeds a height of the patterned gate stack.

8. The gate structure of claim 7, wherein the height of the first spacers is between 300 to 700 Angstroms.

9. The gate structure of claim 1, further comprising a nitride encapsulation layer disposed on opposite sides and adjacent to the first and second spacers such that the patterned gate stack is exposed prior to silicidation, wherein the nitride encapsulation layer protects the source and drain regions.

* * * * *